(12) United States Patent
Giri et al.

(10) Patent No.: US 6,291,272 B1
(45) Date of Patent: Sep. 18, 2001

(54) STRUCTURE AND PROCESS FOR MAKING SUBSTRATE PACKAGES FOR HIGH FREQUENCY APPLICATION

(75) Inventors: Ajay P. Giri, Poughkeepsie; John U. Knickerbocker, Hopewell Junction; David C. Long, Wappingers Falls; Subhash L. Shinde, Cortlandt Manor, all of NY (US); Lisa M. Studzinski, Collierville, TN (US); Rao V. Vallabhaneni, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,563

(22) Filed: Dec. 23, 1999

(51) Int. Cl.[7] .......................... H01L 21/44; H01L 21/48; H01L 21/50
(52) U.S. Cl. .......................... 438/121; 438/108; 438/118
(58) Field of Search .................................. 438/106, 108, 438/118, 121

(56) References Cited

U.S. PATENT DOCUMENTS

| | | |
|---|---|---|
| 5,229,727 | 7/1993 | Clark et al. . |
| 5,232,548 * | 8/1993 | Ehrenberg et al. . |
| 5,389,904 | 2/1995 | Tao et al. . |
| 5,424,693 | 6/1995 | Lin . |
| 5,525,941 | 6/1996 | Roshen et al. . |

* cited by examiner

Primary Examiner—Kevin M. Picardat
Assistant Examiner—D. M. Collins
(74) Attorney, Agent, or Firm—Ira D. Blecker

(57) ABSTRACT

A process for fabricating a microelectronic structure. The process comprises processing a metal carrier having a top surface and a bottom surface, wherein the top surface and the bottom surface are processed to promote adhesion, forming a dielectric layer around the metal carrier, wherein the dielectric layer substantially covers the top surface and the bottom surface of the metal carrier, and applying a first patterned layer of conductive material to the microelectronic structure. In one preferred embodiment, the process further comprises comprising sintering the metal carrier, the dielectric layer, and the first patterned layer of conductive material. In one preferred embodiment, the process further comprises forming a via hole through the metal carrier before the forming of the dielectric layer around the metal carrier, wherein the forming of the dielectric layer comprises forming the dielectric layer inside the via hole.

32 Claims, 3 Drawing Sheets

STRUCTURE AND PROCESS FOR MAKING SUBSTRATE PACKAGES FOR HIGH FREQUENCY APPLICATION

BACKGROUND OF THE INVENTION

The present invention relates generally to packaging for integrated circuits. More particularly, the present invention relates to a structure and process for manufacturing substrate packages for high frequency application.

As substrate packages for integrated circuits on semiconductor chips become denser and faster, there has been a significant increase in the requirements that the substrate packages need to meet. For example the substrate packages designed for microwave applications involve high power density chips and interconnections requiring high currents. This imposes severe restrictions in terms of thermal management and also current carrying capability, on these substrate packages. The substrate packages aimed at applications especially in communications need to be thin and highly brazable. Also, certain electrical design requirements dictate that the backside of the substrate packages be metallized for providing a ground cage and slot line type transmission lines by embedding large area metal features in the dielectric layer. The substrate packages for digital applications require denser wiring and finer features (lines and via holes) to be incorporated at lower costs. It is advantageous if these substrate packages would be available in various coefficient of thermal expansions ranging from $3 \times 10^{-6}$ to $18 \times 10^{-6} C^{-1}$ expanding their application space. There is also a strong drive to reduce the defect density in both the chip carriers and in the passive components in the substrate packages.

The conventional method to build such substrate packages (SCM's and MCM's) utilizes multi-layer-ceramic (MLC) processing. This involves making green sheets from the dielectric powder of choice, screening those green sheets with paste(s) of selected metallization to produce patterns and through sheet connections, or vias, stacking these screened green sheets, laminating the green sheets, and then sintering the green sheets to form a three-dimensionally connected substrate package. Sintering large size substrate packages with the very high metal loading, typically required for the communications packages, creates considerable difficulties in controlling the shrinkage, distortion and flatness of substrate packages at the end of the process. Special processing steps have to be added to assure the flatness of the substrate packages. Also, the backside metallization required to build conventional substrate packages is done by a combination of physical deposition methods and electroplating. The high tolerance required for fabricating substrate packages with very fine features cannot be increased beyond a certain limit due to the distortion of green sheets during various processing steps. Overall processing costs of the substrate packages produced using MLC techniques are relatively higher because of the longer cycle times. Therefore there is a need to develop cost effective ways to produce such substrate packages.

BRIEF SUMMARY OF THE INVENTION

An aspect of the present invention is a process for fabricating a microelectronic structure. The process comprises processing a metal carrier having a top surface and a bottom surface, wherein the top surface and the bottom surface are processed to promote; adhesion, forming a dielectric layer around the metal carrier, wherein the dielectric layer substantially covers the top surface and the bottom surface of the metal carrier, and applying a first patterned layer of conductive material to the microelectronic structure. In one preferred embodiment, the process further comprises sintering the metal carrier, the dielectric layer, and the first patterned layer of conductive material. In one preferred embodiment, the process further comprises forming a via hole through the metal carrier before the forming of the dielectric layer around the metal carrier, wherein the forming of the dielectric layer comprises forming the dielectric layer inside the via hole.

Another aspect of the present invention is a microelectronic structure comprising a metal carrier having a top surface and a bottom surface, a dielectric layer formed around the metal carrier, the dielectric layer substantially covering the top surface and the bottom surface of the metal carrier, and a first patterned layer of conductive material overlying the dielectric layer. In one preferred embodiment, the first pattern layer of conductive material overlies the metal carrier. These and other aspects of the invention will become apparent upon a review of the following detailed description of the presently preferred embodiments of the invention, when viewed in conjunction with the appended drawings.

Figure 1:
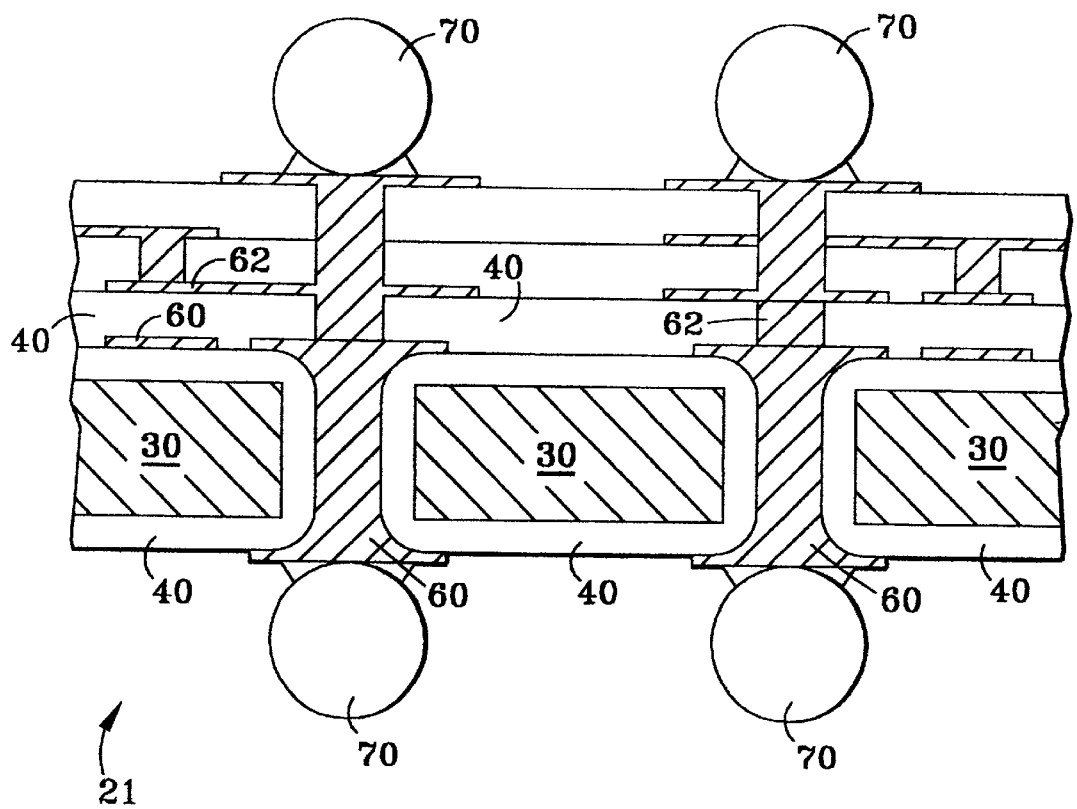
FIG. 1 illustrates, in cross-section, a portion of a substrate package, in accordance with one preferred embodiment of the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PRESENTLY PREFERRED EMBODIMENTS OF THE INVENTION

Figure 6:
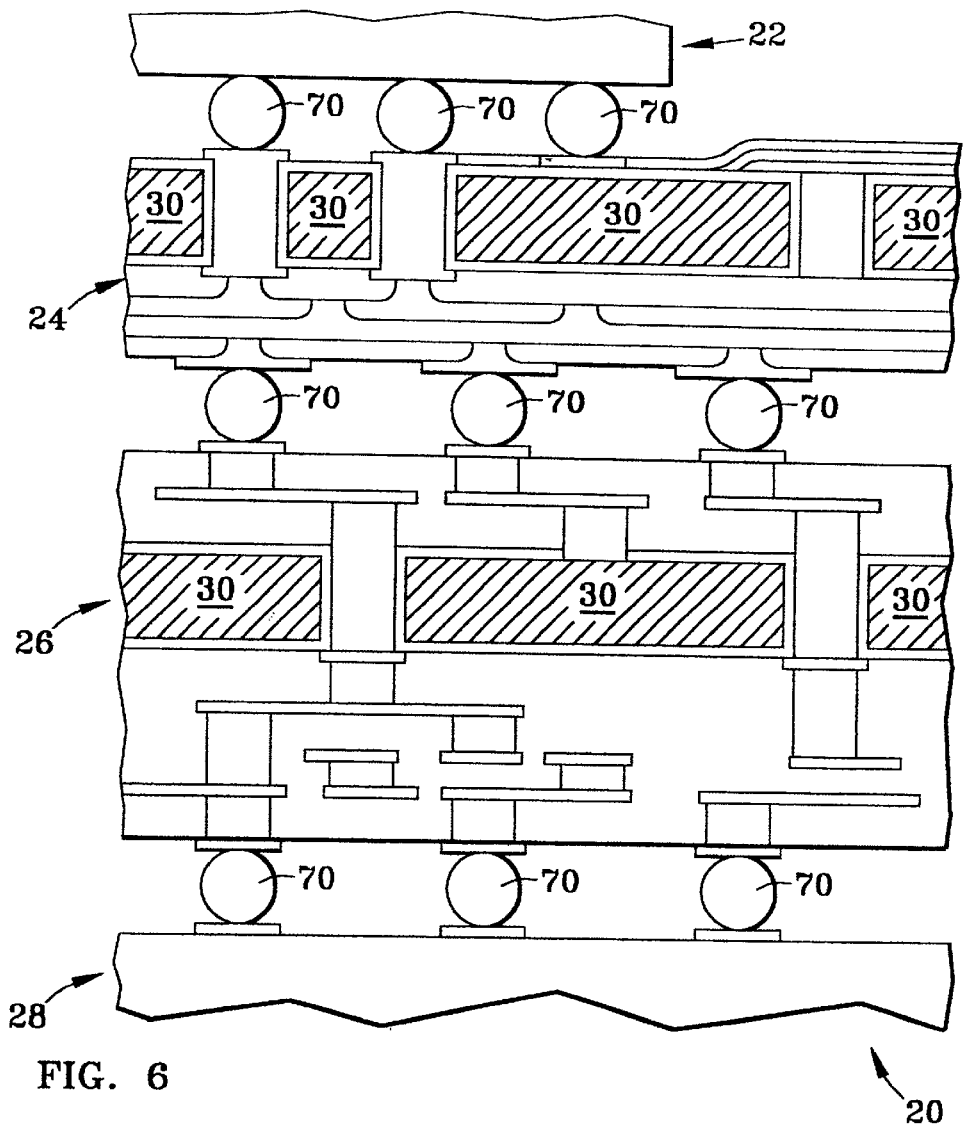
FIG. 6 illustrates, in cross-section, a portion of a first substrate package connected to a portion of a second substrate package and a portion of a third substrate package, in accordance with one preferred embodiment of the invention.

Shown in FIG. 6, in cross-section, is substrate package 20 comprising multiple microelectronic structures 21, such as first microelectronic structure 24, second microelectronic structure 26, third microelectronic structure 28) and semiconductor chip 22. Please note that FIG. 6 illustrates only a portion of substrate package 20. For the sake of clarity, the entire substrate package 20 has been left out of FIG. 6.

The structure and process used to fabricate substrate package 20 of the present invention provides a means to manufacture a low cost microelectronic structure 21 using a combination of metal carrier 30 with ceramics and polymers. The structure and process of the present invention allow one to fabricate microelectronic structures 21 with fine lines, spaces and via holes between layers, control the overall coefficient of thermal expansion of the microelectronic structures 21, and form a multitude of microelectronic structures 21 including chip carriers, capacitors, chip carriers with integral capacitors or other passive components as a portion of the chip carrier. The structure and process of the present invention also allows one to fabricate multiple microelectronic structures 21 in parallel and test them before assembly, thereby significantly reducing the defect levels in the final substrate package 20. The structure of the present invention may comprise one or more layers of metal carriers 30, dielectric layers 40, and vertical interconnects to make up a microelectronic structure 21 designed to meet an application where metal carriers 30, dielectric layers 40, and vertical interconnects, in combination, provide the desired coefficient of thermal expansion, mechanical strength, and also the electrical and thermal management performance. There are many possible combinations for substrate packages 20 having microelectronic structures 21 built with metal carrier 30. Only a few representative examples will be described below.

Figure 2:
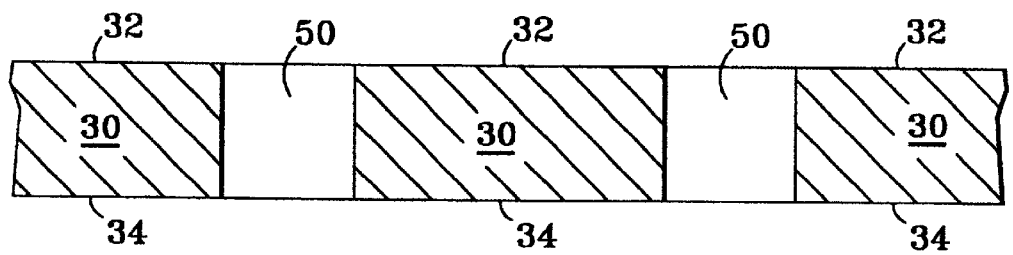
FIGS. 2–5 illustrate, in cross-section, process steps for the fabrication of a strate package, in accordance with one preferred embodiment of the invention.
Figure 3:
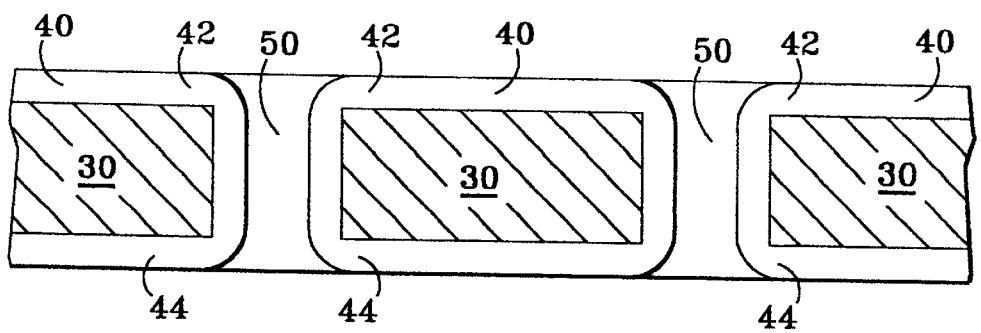
Figure 4:
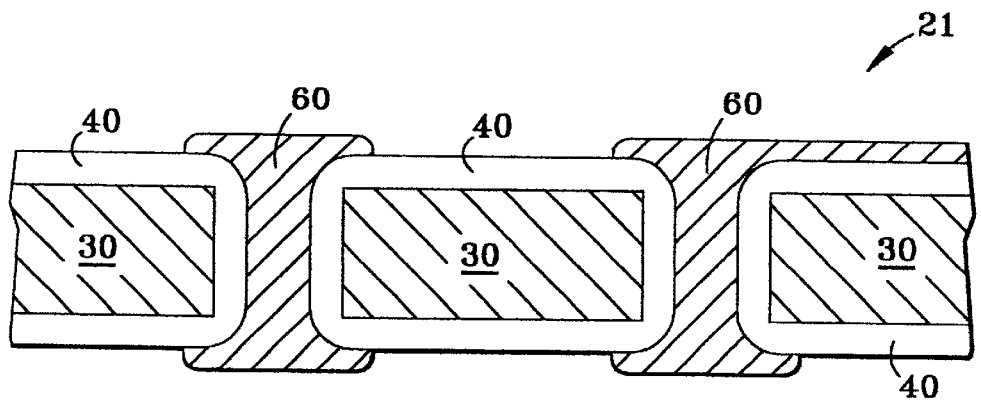
Figure 5:
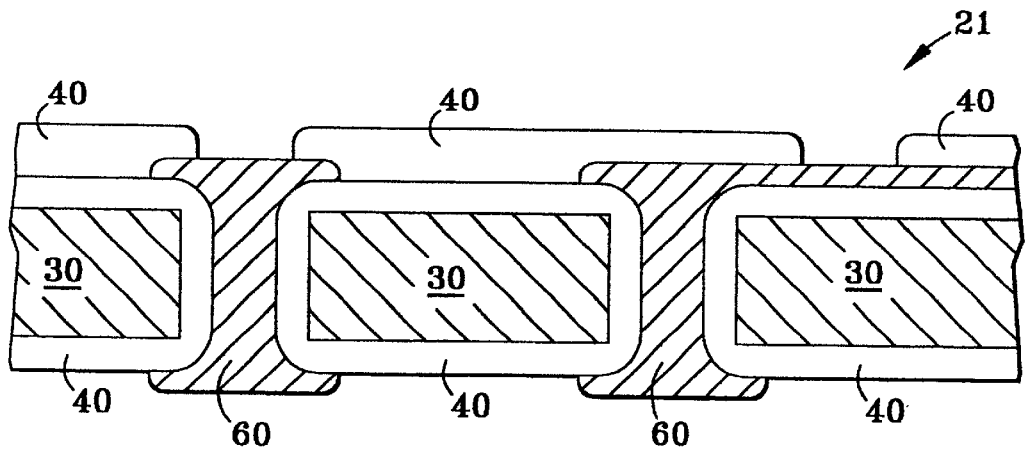

FIGS. 2–4 illustrate a process for fabricating microelectronic structure 21 having metal carrier 30. The process comprises processing metal carrier 30 having top surface 32 and bottom surface 34. Metal carrier 30 is formed from any material that permits the flow of electrons. Preferably metal carrier 30 comprises material selected from the group consisting of titanium, tantalum, molybdenum, tungsten, nickel, copper, gold, silver and aluminum, however, metal carrier 30 may comprise any other metal or material that permits the flow of electrons. Metal carrier 30 conforms to the shape of a generally flat sheet of material, as illustrated in FIG. 2. Top surface 32 and bottom surface 34 of metal carrier 30 are processed to promote adhesion. Top surface 32 and bottom surface 34 may be processed to promote adhesion in any one of a number of ways known to one of ordinary skill in the art, such as, for example wet etching, plasma etching, ion milling, and reactive ion etching. Other process, such as plasma surface treating following by an optimized cleaning process, may also be used to process metal carrier 30. Preferably, metal carrier 30 has a thickness of about 0.03 mm to about 0.20 mm, and more preferably about 0.05 mm.

In one preferred embodiment, via holes 50 are formed through metal carrier 30, as illustrated in FIG. 3. Via holes 50 permit the flow of electrical signals and allow microelectronic structure 21 to be electronically connected to another electronic device such as a second microelectronic structure 21 or a semiconductor chip 22. For example, via holes 50 can carry an electrical signal from semiconductor chip 22, to a one microelectronic structure 21, such as first microelectronic structure 24, or through one microelectronic structure 21 and to another microelectronic structure 21, such as third microelectronic structure 28, as illustrated in FIG. 6. Preferably, via holes 50 are formed by patterning metal carrier 30 using lithography and a wet or dry etching process, however via holes 50 can be formed in any one of a number of ways, such as, for example, using a mechanical punching process, laser assisted wet etching, laser drilling, or any other process or method for forming holes in a metallic structure, such as metal carrier 30, known to one of ordinary skill in the art. In one preferred embodiment, via holes 50 are formed through metal carrier 30 before forming dielectric layer 40 around metal carrier 30. In another preferred embodiment, via holes 50 are formed through metal carrier 30 after forming dielectric layer 40 around metal carrier 30.

Figure 7:
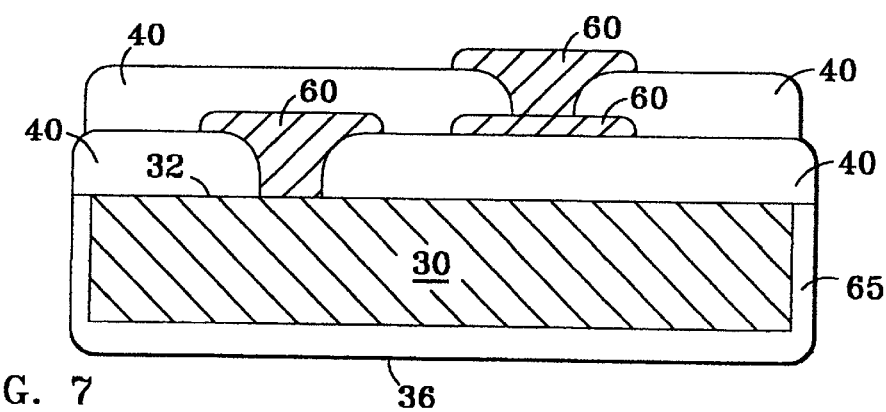
FIG. 7 illustrates, in cross-section, a portion of a substrate package, in accordance with one preferred embodiment of the invention.

In another preferred embodiment, via holes 50 are not formed through metal carrier 30, as illustrated in FIG. 7. In this embodiment, protective layer 65 is formed around metal carrier 30. Protective layer 65 prevents degradation and oxidation of metal carrier 30. Protective layer 65 is comprised of material that can prevent a significant amount of oxide from forming on metal carrier 30 and that can protect metal carrier 30 In one preferred embodiment, protective layer 65 comprises at least one material selected from the group consisting of nickel, gold, and any other metallic, environmentally stable material known to one of ordinary skill in the art. Protective layer 65 substantially covers all the surfaces of metal carrier 30 except for top surface 32, as illustrated in FIG. 7. In one preferred embodiment, additional dielectric layers 40 are placed over metal carrier 30 and protective layer 65, as illustrated in FIG. 7. These additional dielectric layers 40 have gaps or via holes between them, wherein conductive material 60 is placed between the gaps. Preferably, conductive material 60 is placed on only one side of metal carrier 30, as illustrated in FIG. 7, thus creating a microelectronic structure 21 comprising a ground side 36 that can act as a ground plate.

In one preferred embodiment, after metal carrier 30 has been processed, dielectric; layer 40 is formed around metal carrier 30. Dielectric layer 40 prevents electrical charge from migrating between metal carrier 30 and other structures, such as electrodes 70 or via hole 50. Dielectric layer 40 is comprised of any material that can prevent a significant amount of electrical charge from migrating between metal carrier 30 and other structures. In one preferred embodiment, dielectric layer 40 comprises material selected from the group consisting of alumina, mullite, aluminum nitride, forsterite, glass, ceramic, oxide, and any other insulating material known to one of ordinary skill in the art. Dielectric layer 40 substantially covers all the surfaces of metal carrier 30 including top surface 32 and bottom surface 34. In some applications, it is actually required that dielectric layer 40 cover only a portion of the surfaces of metal carrier 30. For example, in one preferred embodiment, dielectric layer 40 is not formed around metal carrier 30, but rather, dielectric layer 40 is formed around a select portion of metal carrier 30 and substantially covers only a select portion of metal carrier 30. In another preferred embodiment, dielectric layer 40 is formed around metal carrier 30, and a portion of dielectric layer 40 is later removed.

Dielectric layer 40 may be formed in any one of a number of ways known to one of ordinary skill in the art, such as, screening a dielectric paste, casting a polymer sheets, thin film deposition, or growing an oxide layer (oxidation). The flexibility achieved by allowing dielectric layer 40 to be formed in any one of a number of ways allows one to produce substrate packages 20 comprising microelectronic structures 21 with different functionality by using different fabrication techniques. Microelectronic structures 21 can later be joined together, as illustrated in FIG. 6, to create substrate package 20. In one preferred embodiment, the forming of dielectric layer 40 comprises forming dielectric layer 40 inside via holes 50, as illustrated in FIG. 3. Dielectric layer 40 must be formed inside via holes 50 so that the subsequent applying of a first patterned layer of conductive material 60 to microelectronic structure 21 does not create an electrically shorted microelectronic structure 21.

In one preferred embodiment, dielectric layer 40 is formed by oxidation. During oxidation, a layer of oxide is grown using any one of a number of processes, such as, for example, thermal oxidation, thermal nitridation, anodization, or any other method for growing oxide known to one of ordinary skill in the art. Oxide grown, using any one of the above mentioned processes, forms an insulating film around metal carrier 30 and inside via hole 50, as illustrated in FIG. 3.

In one preferred embodiment, dielectric layer 40 is formed by screening a ceramic paste around metal carrier 30 and inside any via hole 50. In one preferred embodiment, ceramic paste is screened in such a way as to create an insulating layer on the carrier surface, and to coat the inside surface of via holes 50. In one preferred embodiment, the ceramic paste is then dried in an oven at a temperature of about 25° C. to about 150° C., and more preferably about 75° C. In one preferred embodiment, the ceramic paste is then sintered in a furnace at a temperature of about 400° C. to about 1800° C., and more preferably about 800° C.

In one preferred embodiment dielectric layer 40 is formed by casting a polymer sheet. In this embodiment, the process for forming dielectric layer 40 around metal carrier 30 further comprises placing metal carrier 30 overlying a first polymer sheet, placing a second polymer sheet overlying metal carrier 30, and laminating metal carrier 30, the first polymer sheet and the second polymer sheet, wherein the first polymer sheet fuses to the second polymer sheet. If via holes 50 are formed on metal carrier 30, then the first polymer sheet fuses to the second polymer sheet within via holes 50, and an access hole needs to be formed through a portion of the first polymer sheet and the second polymer sheet, wherein the access hole is located within via holes 50. The access hole can be formed in any one of the number of ways for forming a hole, such as via holes 50, described above. In one preferred embodiment, dielectric layer 40 is formed by spray or dip coating metal carrier 30.

Once dielectric layer 40 is formed, a first patterned layer of conductive material 60 is applied to microelectronic structure 21. Preferably conductive material 60 comprises at least one metal from the group consisting of molybdenum, tungsten, silver, palladium, gold, copper, nickel, platinum, and composites such as polymer metal pastes or ceramic metal pastes, however, conductive material 60 can comprise any material known to one of ordinary skill in the art, which permits the flow of electrons. Preferably, conductive material 60 comprises the same material throughout, however, different materials can be applied to microelectronic structure 21 through the fabrication of microelectronic structure 21. For example, a first patterned layer of conductive material 60 may be applied to microelectronic structure 21 using conductive material 60 which comprises silver, and a second patterned layer of conductive material 60 may be applied to microelectronic structure 21 using conductive material 60 which comprises gold.

A patterned layer of conductive material 60 may be applied to microelectronic structure 21 in any one of a number of ways known to one of ordinary skill in the art to form metal wiring, to form ground planes, to form electrodes 70, to fill via holes 50, or to form any other metallic structure within microelectronic structure 21, as illustrated in FIG. 1. Conductive material 60 may be applied to microelectronic structure 21 in one of a number of ways known to one of ordinary skill in the art, such as, screening a metallic paste, decal transfer, thin film deposition and electroplating. In one preferred embodiment, a combination of methods such as, screening a metallic paste, decal transfer, thin film deposition or electroplating, may be used to apply the first patterned layer of conductive material 60 to microelectronic structure 21. Multiple patterned layers of conductive material 60 may be applied to microelectronic structure 21 by forming dielectric layers 40 overlying the patterned layers of conductive material 60, as illustrated in FIG. 1.

In one preferred embodiment, a patterned layer of conductive material 60 is applied to microelectronic structure 21 by screening a metallic paste such as silverpalladium or copper onto microelectronic structure 21. Once all the layers of the metallic paste have been screened onto microelectronic structure 21, microelectronic structure 21 is sintered at the appropriate temperatures. For example, in one preferred embodiment microelectronic structure 21 is sintered in a furnace at a temperature of about 600° C. to about 1000° C. for about 300 minutes. In the case of sintering screened on ceramic pastes and metallic pastes, the use of metal carrier 30 allows one to control the shrinkage of microelectronic structure 21 with extremely high accuracy, thus making possible the fabrication of multiple microelectronic structures 21 and the joining together of multiple; microelectronic structures 21 with high tolerances. Even higher tolerances may be obtained when thin film dielectrics or polymers are used to form dielectrics layer 40, since the forming of dielectric layer 40 using thin film dielectrics or polymers may be carried out in a protective ambient environment in order to prevent any reaction with metal carrier 30.

In one preferred embodiment, a patterned layer of conductive material 60 is applied to microelectronic structure 21 by using an electroplating process. In this preferred embodiment, a seed layer is deposited on all surfaces of microelectronic structure 21 that are required to bond with a conductive metal. For example, in one preferred embodiment, the seed layer is deposited using a resist stencil inside via holes 50 and on the surfaces of the dielectric layer 40. Once the seed layer is deposited, the surface of the seed layer is electroplated using a patterning plating process with a conductive metal, such as silver, palladium, nickel, copper, gold, platinum, or any other material known to one of ordinary skill in the art which permits the flow of electrons. In one preferred embodiment, the conductive metal in the patterning plating process comprises solder, since solder may be used to join one microelectronic structure 21 to a semiconductor chip 22 or a second microelectronic structure 21, as illustrated in FIG. 6. While only a few select processes for applying a patterned layer of conductive material 60 to metal carrier 30 have been described above, any one of a number of processes known to one of ordinary skill in the art may be used.

In one preferred embodiment, once the patterned layers of conductive material 60 and the dielectric layers 40 have been applied to metal carrier 30, an attachment layer of conductive material 60 may be applied to substrate package 20 in order to facilitate the attachment of one microelectronic structure 21, such as first microelectronic structure 24, to another microelectronic structure 21, such as second microelectronic structure 26, as illustrated in FIG. 6. In one preferred embodiment before individual microelectronic structures 21 are attached to one another or to other devices such as semiconductor chip 22, individual microelectronic structures 21, such as first microelectronic structure 24, are inspected to identify defects. Preferably, microelectronic structures 21 are electronically tested to identify any defects, and repaired if necessary.

In one preferred embodiment, first microelectronic structure 24 is joined to second microelectronic structure 26. First microelectronic structure 24 may be joined to second microelectronic structure 26 using any one of a number of processes, such as, solder bump technology, lamination, and electrically conducting organic interconnections, as illustrated in FIG. 6.

In one preferred embodiment, multiple microelectronic structures 21 are all fabricated on a single metal carrier 30.

In this embodiment, upon fabricating microelectronic structures 21, the single metal carrier 30 is diced into multiple microelectronic structures 21. Dicing involves cutting the single metal carrier 30 into multiple metal carriers 30.

The preferred embodiments described above describe only some of the many possible methods and processes for creating microelectronic structures 21. Since there are many possible methods and processes for creating microelectronic structures 21, a description of the physical structures of microelectronic structure 21 will be necessary.

FIG. 1 illustrates the physical structure for microelectronic structure 21, which can be formed by the above-described processes and methods. Microelectronic structure 21 comprises metal carrier 30 having top surface 32 and bottom surface 34. Metal carrier 30 is processed to promote adhesion, as described above. In one preferred embodiment, metal carrier 30 comprises via holes 50, formed in accordance with the above described methods. Via holes 50 comprise an inside surface which defines perimeter of via holes 50. Dielectric layer 40 overlies metal carrier 30, substantially covering top surface 32 and bottom surface 34 of metal carrier 30. In one preferred embodiment, dielectric layer 40 substantially covers the inside surface of via holes 50. A first patterned layer of conductive material 60 overlies dielectric layer 40. In one preferred embodiment, the first patterned layer of conductive material 60 overlies metal carrier 30. Additional patterned layers of conductive material 60 may placed over metal carrier 30 by placing additional dielectric layers 40 over existing patterned layers of conductive material 60, as illustrated in FIG. 1.

In one preferred embodiment, once the patterned layers of conductive material 60 and the dielectric layers 40 have been applied to metal carrier 30, an attachment layer of conductive material 60 may be placed overlying substrate package 20 in order to facilitate the attachment of one microelectronic structure 21, such as first microelectronic structure 24, to another microelectronic structure 21, such as second microelectronic structure 26, as illustrated in FIG. 6.

It is to be understood that a wide range of changes and modifications to the embodiments described above will be apparent to those skilled in the art are contemplated. It is therefore intended that the foregoing detailed description be regarded as illustrative, rather than limiting, and that it be understood that it is the following claims, including all equivalents, that are intended to define the spirit and scope of the invention.

What is claimed is:

1. A process for fabricating a microelectronic structure comprising:
   processing a metal carrier having a top surface and a bottom surface;
   forming a dielectric layer around the metal carrier, wherein the dielectric layer substantially covers the top surface and the bottom surface of the metal carrier, and wherein the dielectric layer comprises a material selected from the group consisting of alumina, mullite, aluminum nitride, forsterite, glass, ceramic, and oxide; and
   applying a first patterned layer of conductive material to the microelectronic structure.

2. The process of claim 1, further comprising sintering the metal carrier, the dielectric layer, and the first patterned layer of conductive material.

3. The process of claim 1, wherein the processing of the metal carrier comprises a process selected from the group consisting of wet etching, plasma etching, ion milling, and reactive ion etching.

4. The process of claim 1, further comprising forming a via hole through the metal carrier before the forming of the dielectric layer around the metal carrier, wherein the forming of the dielectric layer comprises forming the dielectric layer inside the via hole.

5. The process of claim 4, wherein the forming of the dielectric layer around the metal carrier comprises screening a ceramic paste around the metal carrier and inside the via hole.

6. The process of claim 4, wherein the forming of the dielectric layer around the metal carrier comprises growing an oxide layer.

7. The process of claim 1, wherein the applying of the first patterned layer of conductive material to the microelectronic structure comprises a process selected from the group consisting of screening, decal transfer, deposition, and electroplating.

8. The process of claim 2, further comprising applying a second patterned layer of conductive material to the microelectronic structure after the sintering of the metal carrier.

9. The process of claim 8, wherein the applying of the second patterned layer of conductive material to the microelectronic structure comprises a process selected from the group consisting of screening, decal transfer, deposition, and electroplating.

10. The process of claim 1, wherein the forming of the dielectric layer around the metal carrier comprises forming the dielectric layer using a process selected from the group consisting of screening a ceramic paste, thin film deposition, and growing an oxide layer.

11. A process for making an electronic device comprising:
   fabricating a first microelectronic structure by the process of claim 10, wherein the first microelectronic structure comprises at least one electrode extending from the first microelectronic structure; and
   forming the electronic device comprising the first microelectronic structure.

12. The process of claim 11 further comprising inspecting the first microelectronic structure to identify defects.

13. The process of claim 11 further comprising:
   fabricating a second microelectronic structure by the process of claim 10, wherein the second microelectronic structure comprises at least one electrode extending from the second microelectronic structure;
   joining the at least one electrode extending from the first microelectronic structure to the at least one electrode extending from the second microelectronic structure; and
   forming the electronic device comprising the first microelectronic structure and the second microelectronic structure.

14. The process of claim 13, wherein the joining of the first microelectronic structure to the second microelectronic structure comprises a process selected from the group consisting of solder bump technology, lamination, and electrically conducting organic interconnections.

15. The process of claim 13, further comprising inspecting the first microelectronic structure and the second microelectronic structure to identify defects before the joining of the first microelectronic structure to the second microelectronic structure.

16. A process for fabricating a microelectronic structure comprising:
   applying a first patterned layer of conductive material to a dielectric layer, wherein the dielectric layer is formed around a metal carrier having a top surface and a bottom surface, the dielectric layer substantially covering the top surface and the bottom surface of the metal carrier, and wherein the dielectric layer comprises a material selected from the group consisting of alumina, mullite, aluminum nitride, forsterite, glass, ceramic, and oxide.

17. The process of claim 16, further comprising sintering the metal carrier, the dielectric layer, and the first patterned layer of conductive material.

18. The process of claim 16, further comprising forming a via hole through the metal carrier before the applying of the first patterned layer of conductive material to the dielectric layer, wherein the dielectric layer is formed inside the via hole.

19. The process of claim 1, wherein the top surface and the bottom surface of the metal carrier are processed to promote adhesion.

20. A process for fabricating a microelectronic structure comprising:

processing a metal carrier having a top surface and a bottom surface;

forming a dielectric layer on the top surface of the metal carrier; and applying a first patterned layer of conductive material to the microelectronic structure.

21. The process of claim 1 further comprising forming a protective layer on all the surfaces of the metal carrier except for the top surface of the metal carrier.

22. The process of claim 20, further comprising sintering the metal carrier, the dielectric layer, and the first patterned layer of conductive material.

23. The process of claim 20, wherein the processing of the metal carrier comprises a process selected from the group consisting of wet etching, plasma etching, ion milling, and reactive ion etching.

24. The process of claim 20, further comprising forming a via hole in the dielectric layer, wherein conductive material is placed inside the via hole.

25. The process of claim 20, wherein the forming of the dielectric layer on the top surface of the metal carrier comprises screening a ceramic paste on the metal carrier.

26. The process of claim 20, wherein the forming of the dielectric layer on the metal carrier comprises growing an oxide layer.

27. The process of claim 21, wherein the protective layer comprises at least one material selected from the group consisting of nickel and gold.

28. The process of claim 21, wherein the protective layer substantially covers all the surfaces of the metal carrier except for the top surface of the metal carrier.

29. The process of claim 20, wherein the applying of the first patterned layer of conductive material to the microelectronic structure comprises a process selected from the group consisting of screening, decal transfer, deposition, and electroplating.

30. The process of claim 22, further comprising applying a second patterned layer of conductive material to the microelectronic structure after the sintering of the metal carrier.

31. The process of claim 30, wherein the applying of the second patterned layer of conductive material to the microelectronic structure comprises a process selected from the group consisting of screening, decal transfer, deposition, and electroplating.

32. The process of claim 20, wherein the forming of the dielectric layer around the metal carrier comprises forming the dielectric layer using a process selected from the group consisting of screening a dielectric paste, casting a polymer sheet, thin film deposition, and growing an oxide.

* * * * *